United States Patent
Nagata et al.

(10) Patent No.: US 8,780,080 B2
(45) Date of Patent: Jul. 15, 2014

(54) INPUT DEVICE, DISPLAY DEVICE AND PORTABLE TERMINAL

(75) Inventors: Yasunari Nagata, Kirishima (JP);
Natsuko Yamagata, Kirishima (JP);
Takashi Minami, Kirishima (JP)

(73) Assignee: Kyocera Corporation, Fushimi-Ku, Kyoto (JP)

( * ) Notice: Subject to any disclaimer, the term of this patent is extended or adjusted under 35 U.S.C. 154(b) by 198 days.

(21) Appl. No.: 13/519,676

(22) PCT Filed: Feb. 7, 2011

(86) PCT No.: PCT/JP2011/052502
§ 371 (c)(1),
(2), (4) Date: Jun. 28, 2012

(87) PCT Pub. No.: WO2011/105202
PCT Pub. Date: Sep. 1, 2011

(65) Prior Publication Data
US 2012/0287082 A1    Nov. 15, 2012

(30) Foreign Application Priority Data

Feb. 24, 2010   (JP) ................. 2010-038543

(51) Int. Cl.
*G06F 3/044* (2006.01)
(52) U.S. Cl.
USPC .......................................... 345/174; 345/173
(58) Field of Classification Search
USPC .................................................. 345/156–173
See application file for complete search history.

(56) References Cited

U.S. PATENT DOCUMENTS

| 7,737,637 B2 * | 6/2010 | Koshihara et al. ............ 313/512 |
| 8,217,902 B2 * | 7/2012 | Chang et al. ................. 345/173 |
| 2002/0185999 A1 | 12/2002 | Tajima et al. |
| 2008/0100592 A1 | 5/2008 | Shigeno et al. |
| 2010/0188354 A1 * | 7/2010 | Tamura ......................... 345/173 |
| 2010/0231542 A1 | 9/2010 | Momose |
| 2012/0132511 A1 | 5/2012 | Tanaka et al. |

FOREIGN PATENT DOCUMENTS

| JP | 2002-366291 A | 12/2002 |
| JP | 2008-097283 A | 4/2008 |
| JP | 2008-310551 A | 12/2008 |
| JP | 3154829 U | 10/2009 |
| JP | 2010211647 A | 9/2010 |
| JP | 2010-277354 A | 12/2010 |

OTHER PUBLICATIONS

Japanese Office Action with English Translation, Japanese Patent Application No. 2011-255158, 6pp.

* cited by examiner

*Primary Examiner* — Viet Pham
(74) *Attorney, Agent, or Firm* — Volpe and Koenig, P.C.

(57) ABSTRACT

According to one aspect of the present invention, an input device includes: a substrate; first detection electrodes; second detection electrodes; a first connection electrode; an insulator; and a second connection electrode. The first detection electrodes are provided on or above the substrate and arrayed along a first direction. The second detection electrodes are provided on or above the substrate and arrayed along a second direction. The first connection electrode is provided on or above the substrate and connecting adjacent first detection electrodes. The insulator is provided on or above the substrate so as to cover the first connection electrode. The second connection electrode is provided on or above the insulator so as to straddle over the insulator, and connecting adjacent second detection electrodes. The portion of the first detection electrodes covers a portion of the insulator.

10 Claims, 14 Drawing Sheets

INPUT DEVICE, DISPLAY DEVICE AND PORTABLE TERMINAL

CROSS-REFERENCE TO RELATED APPLICATIONS

This application is national stage application of International Application No. PCT/JP2011/052502, filed Feb. 7, 2011, which designates the United States, incorporated herein by reference, and which claims the benefit of priority from Japanese Patent Application No. 2010-038543, filed on Feb. 24, 2010, the entire contents of which are incorporated herein by reference.

TECHNICAL FIELD

The present invention relates to an input device, display device and portable terminal, which detect a location at where an input operation is made by a user as an input location, for example.

BACKGROUND ART

As an input device, for example, there is known a capacitive-sensing-type touch panel, which captures changes in electrostatic capacity between a finger and a detection electrode to detect the input location (for example, see Patent Literatures 1 and 2).

Such an input device includes a substrate, first detection electrodes arranged in a first direction, and second detection electrodes arranged in a second direction. The input device further includes: a first connection electrode connecting adjacent first detection electrodes; an insulator covering the first connection electrode; and a second connection electrode provided on or above the insulator, straddling over the insulator and connecting adjacent second detection electrodes.

When the user repeatedly pushes the above input device for input operations, a stress is given on the insulator in response to the input operation. When the stress is given on the insulator, there is a possibility that the insulator is peeled off of the substrate. If the insulator is peeled off of the substrate, there is a possibility that the second connection electrode is disconnected, which reduces the reliability of the input device.

Patent Literature 1: Japanese Patent Application Laid-open No. 2008-97283
Patent Literature 2: Japanese Patent Application Laid-open No. 2008-310551

SUMMARY OF THE INVENTION

The present invention was made in view of the above problems, and its object relates to an input device, display device and portable terminal, which improve the reliability.

An input device according to one aspect of the present invention comprises: a substrate; first detection electrodes provided on or above the substrate and arrayed along a first direction; second detection electrodes provided on or above the substrate and arrayed along a second direction; a first connection electrode provided on or above the substrate and connecting adjacent first detection electrodes; an insulator provided on or above the substrate so as to cover the first connection electrode; and a second connection electrode provided on or above the insulator so as to straddle over the insulator, and connecting adjacent second detection electrodes, wherein a portion of the first detection electrodes covers a portion of the insulator.

MODE(S) FOR CARRYING OUT THE INVENTION

Figure 1:
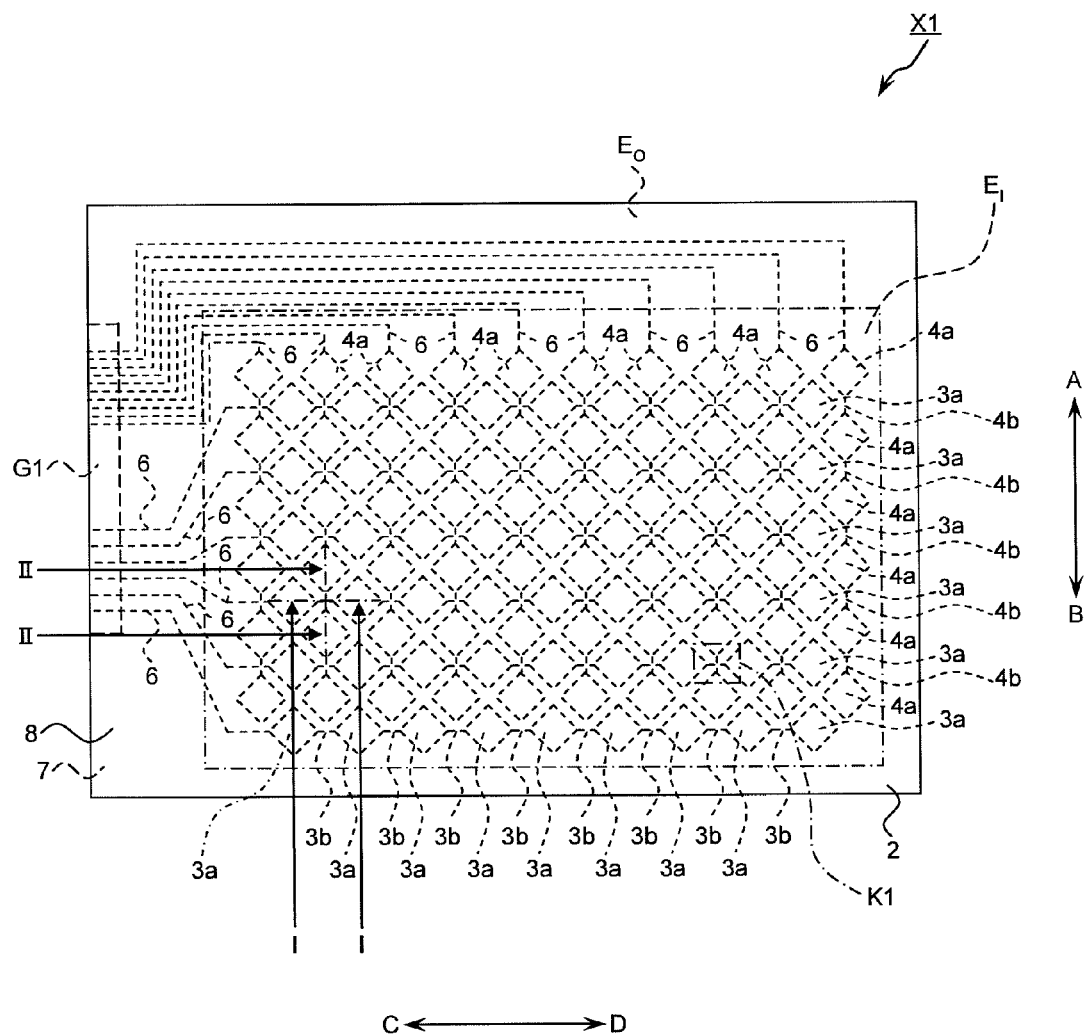
FIG. 1 is a plan view illustrating a schematic configuration of an input device according to one embodiment of the present invention.

An embodiment of the present invention will be described below with reference to the drawings.

However, for the sake of convenience in the description, the drawings referenced below illustrate simplifications of, among the constituent members of one embodiments of the present invention, only main members necessary for describing the present invention. Accordingly, an input device, a display device and a portable terminal according to the present invention may include arbitrary constituent members that are not illustrated in the drawings referenced to in this description.

As illustrated in FIG. 1, an input device X1 according to the embodiment is a capacitive-sensing-type touch panel, and has an input region $E_I$ where input operations are made by a user and an outer region $E_O$ located outside of the input region $E_I$.

Figure 2:
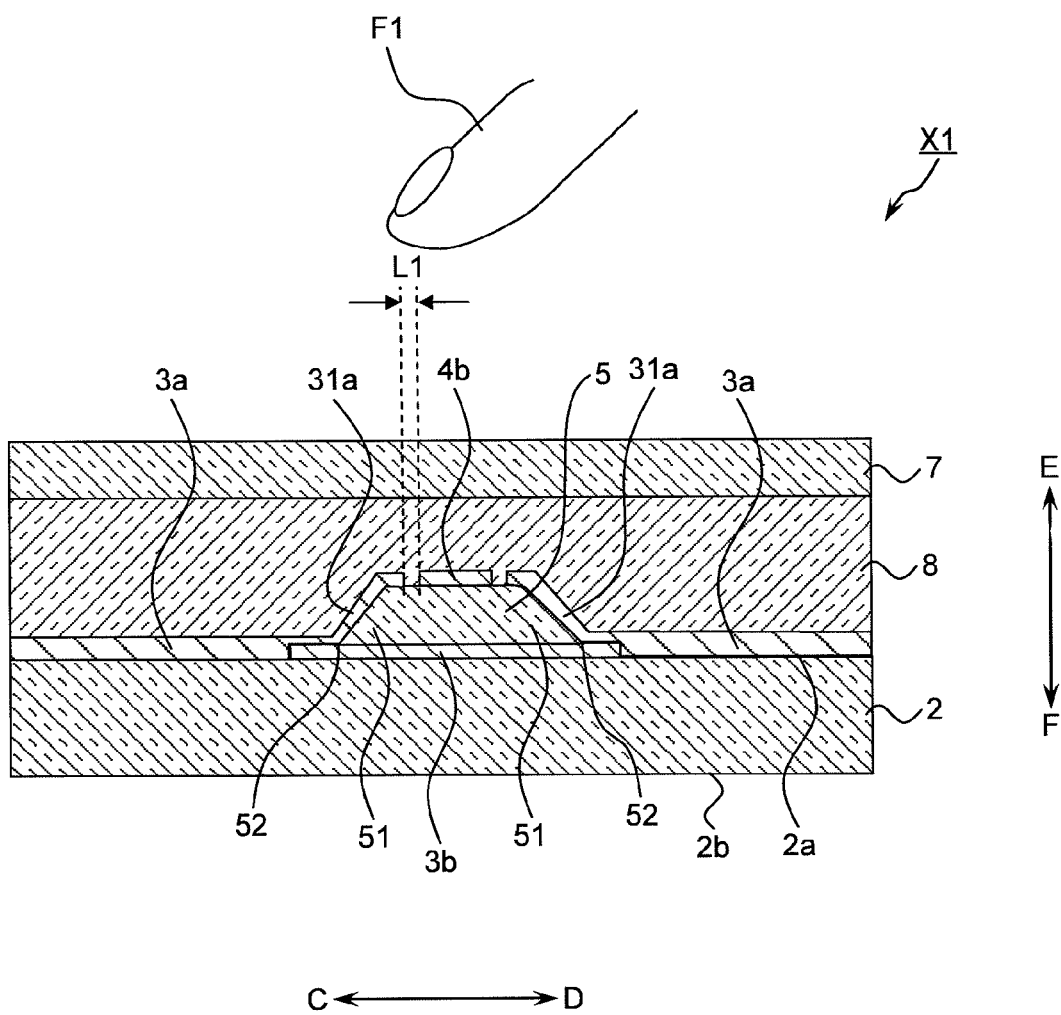
FIG. 2 is a sectional view taken along line I-I illustrated in FIG. 1.
Figure 3:
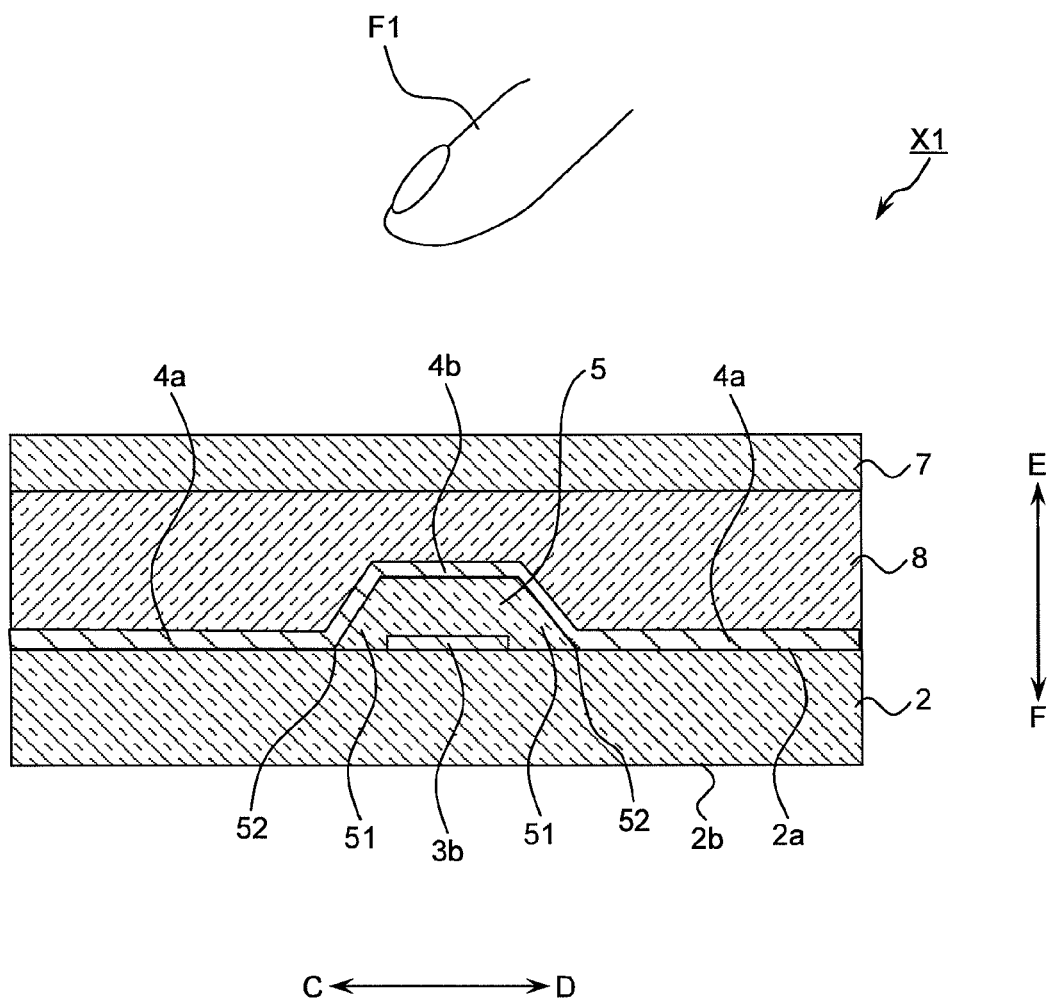
FIG. 3 is a sectional view taken along line II-II illustrated in FIG. 1.

As illustrated in FIGS. 1 to 3, the input device X1 has a substrate 2.

The substrate 2 plays a role in supporting first detection electrodes 3a, first connection electrodes 3b, second detection electrodes 4a, and second connection electrodes 4b (which will be described later) in the input region $E_I$, and also plays a role in supporting wiring conductors 6 (which will be described later) in the outer region $E_O$. The substrate 2 has a first main surface 2a, and a second main surface 2b opposite the first main surface 2a. The substrate 2 is configured to be appropriately transmissive to light in a direction intersecting these main surfaces 2a and 2b (arrow E-F direction), and also to have insulation properties. The materials of the substrate 2 include, for example, those having light transparency such as a transparent glass and a transparent plastic, in particular, preferably a transparent glass from the visibility point of view. In this specification, "transparency" means having transparent properties with respect to visible light. Although the substrate 2 according to this embodiment has a substantially rectangular shape in the plan view, it is not limited thereto. For example, it may have a circular shape or polygonal shape.

Figure 4:
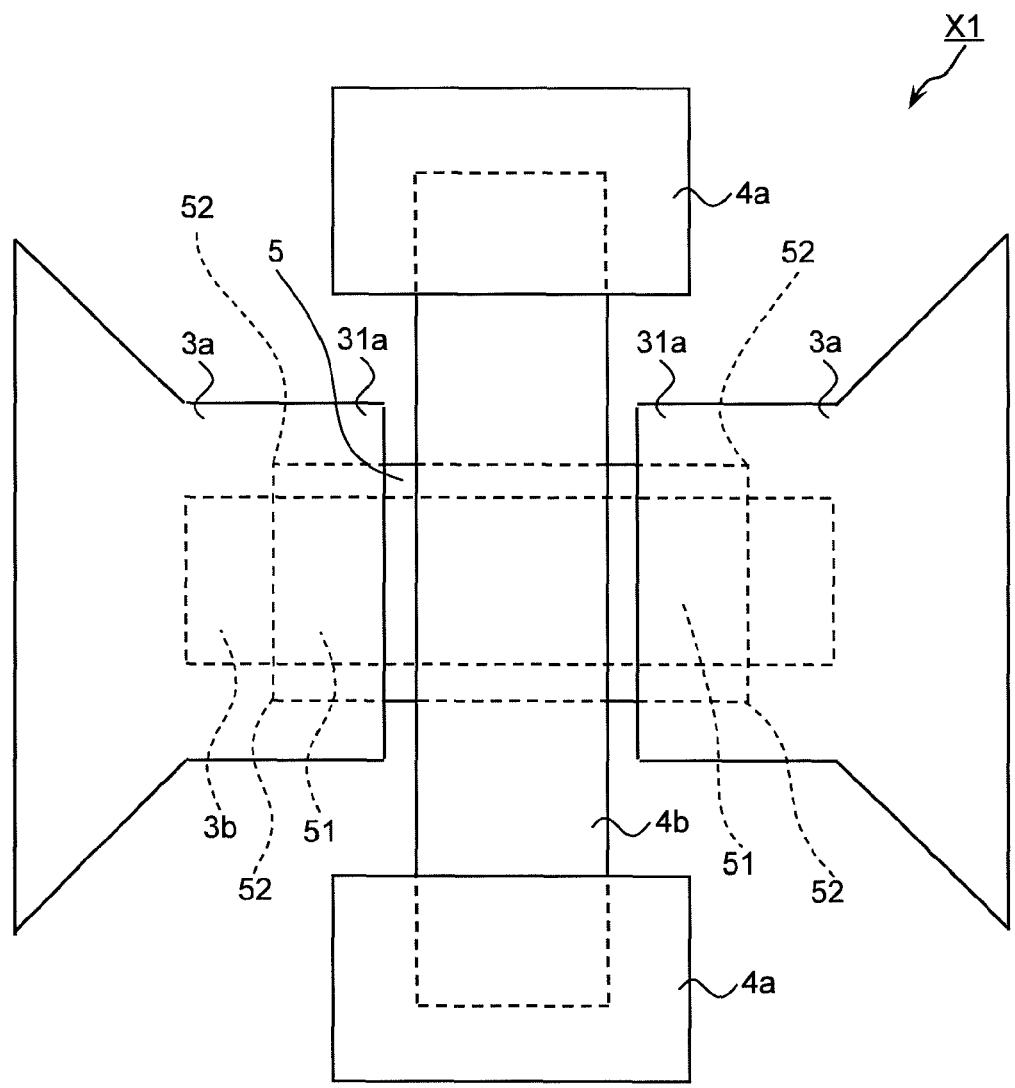
FIG. 4 is an enlarged perspective view of a portion K1 of FIG. 1.

As illustrated in FIGS. 2 to 4, the first detection electrodes 3a, the first connection electrodes 3b, the second detection electrodes 4a, the second connection electrodes 4b, and insulators 5 are provided on or above the first main surface 2a of the substrate 2, which corresponds to the input region $E_I$.

The first detection electrodes 3a play a role in detecting, in a first direction (arrow A-B direction), the input location of a finger F1 of the user that has come closer to the input region $E_I$, and have the function of producing electrostatic capacity between the input region $E_I$ and the finger F1. That is, the first detection electrodes 3a are spaced apart from each other at a predetermined spacing, and provided along a second direction (arrow C-D direction) on or above the first main surface 2a of the substrate 2. From the point of view of improving the detection sensitivity, the first detection electrodes 3a have a substantially rhombus shape in the plan view, but it is not limited thereto.

The first connection electrodes 3b are members that each play a role in electrically connecting adjacent first detection electrodes 3a. The first connection electrodes 3b are provided on or above the first main surface 2a of the substrate 2.

The second detection electrodes 4a play a role in detecting, in a second direction (arrow C-D direction), the input location of the finger F1 of the user that has come closer to the input region $E_I$, and have the function of producing electrostatic capacity between the input region $E_I$ and the finger F1. The second direction in this embodiment is a direction perpendicular to the first direction. That is, the second detection electrodes 4a are spaced apart from each other at a predetermined spacing, and provided along the first direction (arrow A-B direction) on or above the first main surface 2a of the substrate 2. From the point of view of improving the detection sensitivity, the second detection electrodes 4a have a substantially rhombus shape in the plan view, but it is not limited thereto.

Each of the second connection electrodes 4b plays a role in electrically connecting adjacent second detection electrodes 4a. The second connection electrode 4b is provided on or above the insulator 5 so as to be insulated from the first connection electrode 3b and to straddle over the insulator 5. Here, the insulator 5 is provided on or above the first main surface 2a of the substrate 2 so as to cover the first connection electrode 3b. The materials of the insulators 5 may include, for example, transparent resin such as acrylic resin, epoxy resin and silicone resin.

The materials of the above first detection electrodes 3a, the first connection electrodes 3b, the second detection electrodes 4a and the second connection electrodes 4b may include, for example, conductive members having transparent properties. The conductive members having transparent properties may include, for example, ITO (Indium Tin Oxide), IZO (Indium Zinc Oxide), ATO (Antimony Tin Oxide), AZO (Al-Doped Zinc Oxide), stannic oxide, zinc oxide and electroconductive polymer (for example, PEDOT, PSS and the like).

Here, portions of the first detection electrodes 3a, respectively, cover a portion of the insulator 5. Therefore, even when a stress is given on the insulator 5 in response to input operations, in which the user pushes repeatedly, the input device X1 may reduce the possibility of the insulator 5 to be peeled off from the substrate 2. Thus, the input device X1 may improve the reliability as compared with the above conventional input device.

In addition, as illustrated in FIG. 4, in the plan view, it is preferred that ends 31a of the adjacent first detection electrodes 3a, respectively, are provided to interpose the second connection electrode 4b therebetween, and to cover both ends 51 of the insulator 5, respectively. In this manner, the insulator 5 is covered by not only the second connection electrode 4b, but also two ends 31a of first detection electrodes 3a. Therefore, the input device X1 may reduce the possibility of the insulator 5 to be peeled off from the substrate 2.

As in this embodiment, it is preferred that the insulator 5 has a rectangular shape, and preferred that the ends 31a of the adjacent first detection electrodes 3a, respectively, are provided to interpose the second connection electrode 4b therebetween, and to cover corners 51 of the insulator 5, respectively. In this embodiment, since the corners 52 of the insulator 5 have a substantially right angle in the plan view, the insulator 5 is easy to be peeled off from the substrate 2 from the corners 52. Therefore, as in this embodiment, the possibility of the insulator 5 to be peeled off from the substrate 2 may be reduced by providing the ends 31a of the adjacent first detection electrodes 3a in a manner so as to cover the corners 52 of the insulator 5.

Furthermore, since the insulator 5 is covered with not only the second connection electrode 4b but also with the two ends 31a of the first detection electrodes 3a, respectively, in the plan view, the possibility that the insulator 5 adsorbs moisture may be reduced. As the possibility that the insulator 5 absorbs moisture may be reduced, the input device X1 may improve the reliability as compared with the above conventional input device. This is because the second connection electrode 4b and the portion of the first detection electrodes 3a positioned on or above the insulator 5 may be eroded when the insulator 5 absorbs moisture. This is also because the adhesion between the insulator 5 and the substrate 2 and between the insulator 5 and the second connection electrode 4b may be lowered when the insulator 5 absorbs moisture.

In addition, in the input device X1, the portion of the first detection electrode 3a is provided so as to cover a portion of the insulator 5. Therefore, as illustrated in FIG. 2, distance L1 between one end 31a of the first detection electrode 3a and a corresponding second connection electrode 4b is decreased. Therefore, the input device X1 improves the detection sensitivity because the amount of change in electrostatic capacity between the first detection electrodes 3a and the second connection electrodes 4b increases as compared with the above input device.

In addition, the wiring conductors 6 are provided on or above the first main surface 2a of the substrate 2, which corresponds to the outer region $E_O$.

The wiring conductors 6 are members that play a role in applying voltage to the first detection electrodes 3a and the second detection electrodes 4a. The wiring conductors 6 are electrically connected to the first detection electrodes 3a and the second detection electrodes 4a at one end, and positioned in the outer conductor region G1 at the other end. The wiring conductor 6 is made of a metallic thin film in order to obtain high rigidity and high shape stability, for example. This metallic thin film may include, for example: an aluminum film; an aluminum alloy film; a laminated film made of a chromium film and an aluminum film; a laminated film made of a chromium film and an aluminum alloy film; a silver film; a silver alloy film; and a gold alloy film. The method of forming the above metallic thin film may include, for example, a sputtering method, evaporation method, and CVD (chemical vapor deposition) method.

A protective member 7 plays a role in protecting the first detection electrodes 3a, the second detection electrodes 4a and the wiring conductors 6 against user's input operations. Therefore, the protective member 7 is provided so as to cover the first detection electrodes 3a, the second detection electrodes 4a, and the wiring conductors 6. That is, the protective member 7 is a member where the user's finger F1 directly touches, and is bonded to the first main surface 2a of the substrate 2 through a bonding member 8. The protective member 7 may include, for example, a polyethylene terephthalate (PET) film, an acryl film, a polycarbonate film, and a resin film. In addition, the bonding member 8 may include, for example, an acrylic pressure sensitive adhesive, a silicone pressure sensitive adhesive, a rubber pressure sensitive adhesive, and a urethane pressure sensitive adhesive.

Now, the detection principle of the input device X1 will be described.

When the finger F1, which is an electric conductor, comes close to, touches, or pushes the protective member 7, which corresponds to the input region $E_I$, the electrostatic capacity changes between the finger F1 and the detection electrodes 3a, 4a. Here, a position sensing driver (not illustrated) provided in the input device X1 continuously detects the changes of the electrostatic capacity between the finger F1 and the detection electrodes 3a, 4a. Upon detecting a change in the electrostatic capacity larger than a predetermined value, the position sensing driver detects the location where the change of the electrostatic capacity has been detected, as an input location. In this manner, the input device X1 detects the input locations. The type of the input device X1 detecting input locations may be either mutual capacitance type or self-capacitance type. The mutual capacitance type may detect multiple input locations simultaneously, and is thus preferable as compared with the self-capacitance type.

As discussed above, the input device X1 improves the reliability.

Although the above description has been made with respect to the exemplary embodiment of the input device X1, in which input operations are made through the protective member 7, which corresponds to the input region $E_I$, it is not limited thereto. That is, the input device may be one, in which input operations are made through the second main surface 2b, which corresponds to the input region $E_I$. That is, the second main surface 2b of the substrate 2 may be a surface where the finger F1 of the user directly touches. Alternatively, the second main surface 2b of the substrate 2 may be a surface where the finger F1 of the user directly touches through a member such as a protective film. However, the input device X1, in which input operations are made through the protective member 7 corresponding to the input region $E_I$, is preferable because it allows the distance between the finger F1 and the detection electrodes 3a, 4a to be short, and allows the detection sensitivity to be improved. That is, this is because the thickness of the protective member 7 is less than the thickness of the substrate 2.

Figure 5:
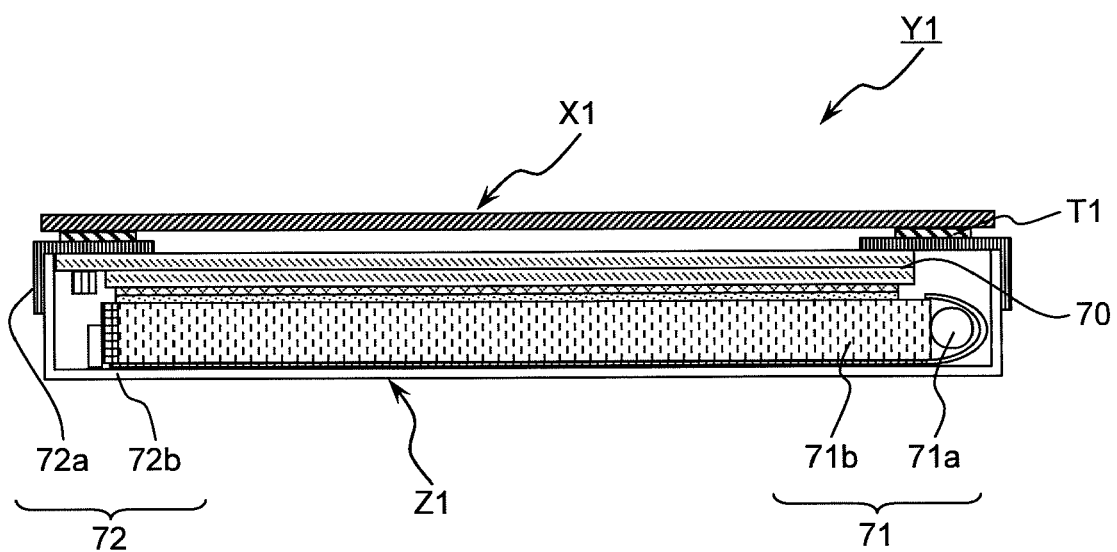
FIG. 5 is a sectional view illustrating a schematic configuration of a display device according to one embodiment of the present invention.

FIG. 5 is a sectional view illustrating the schematic configuration of display device Y1 according to this embodiment. As illustrated in FIG. 5, the display device Y1 includes the above input device X1, and a liquid crystal display device Z1 arranged facing the input device X1.

The liquid crystal display device Z1 includes liquid crystal display panel 70, a backlight 71, and a housing 72.

The backlight 71 includes a light source 71a and a light guide plate 71b. The light source 71a is a member that plays a role in emitting light toward the light guide plate 71b, and is composed of a light emitting diode (LED), for example. Instead of a LED, a cathode fluorescent lamp (CCFL), a halogen lamp, a xenon lamp, an electro-luminescence (EL) may be employed. The light guide plate 71b is a member that plays a role in substantially evenly guiding light from the light source 71a across the undersurface of the liquid crystal display panel 70.

The housing 72 plays a role in housing the liquid crystal display panel 70 and the backlight 71, and includes an upper housing 72a and a lower housing 72b. The materials of the housing 72 may include, for example, resins such as polycarbonate, or metals such as stainless (SUS) and aluminum.

Here, the input device X1 and the liquid crystal display Z1 are bonded with a double-sided adhesive tape T1. That is, the input device X1 and the liquid crystal display device Z1 are bonded with the double-sided adhesive tape T1 such that the second main surface 2b of the substrate 2 of the input device X1 is arranged opposing the main surface of the liquid crystal display panel 70. The fixing member used in fixing the input device X1 and the liquid crystal display device Z1 is not limited to the double-sided adhesive tape T1, but may be an adhesive member such as thermosetting resin and ultraviolet curable resin, or a fixing structure for physically fixing the input device X1 and the liquid crystal display device Z1.

In this manner, one may input various pieces of information through the input device X1 by making input operations on the input region $E_I$ of the input device X1, while the user sees the liquid crystal display panel 70 of the liquid display device Z1 through the input device X1. The input device X1 may be granted a function of giving various tactile impressions such as pushing feeling, tracing feeling, and texture feeling. In this case, it is achieved by furnishing the substrate of the input device X1 with one or more vibrators, and vibrating these vibrators with a predetermined frequency when a certain input operation or a certain pushing load is detected.

The above display device Y1 is installed in a portable terminal such as a mobile phone, a smart phone and a personal digital assistant (PDA), an electronic organizer, a personal computer, a copying machine, a game terminal, and the like.

Figure 6:
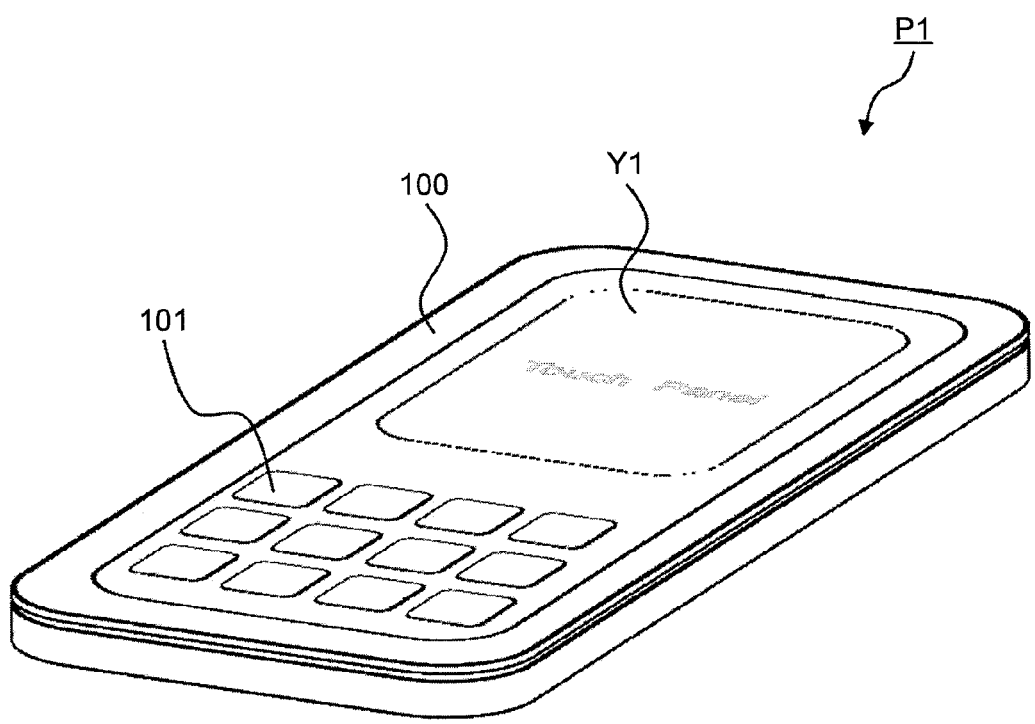
FIG. 6 is an external view illustrating a schematic configuration of a portable terminal according to one embodiment of the present invention.

FIG. 6 is a schematic view illustrating the schematic configuration of a portable terminal P1 according to this embodiment. As illustrated in FIG. 6, the portable terminal P1 includes the above display device Y1, a housing 100, and operation keys 101. The housing 100 is a member that plays a role in housing the display device Y1. The operation keys 101 are keys, on which input operations are made by the user. The operation keys 101 may be operation keys displayed on a display screen, or operation keys that physically exist.

The portable terminal P1 is provided with the above location detection driver in order to detect the input location of the input device X1. Upon detecting a change in the electrostatic capacity larger than a predetermined value, this location detection driver detects the location where the change of the electrostatic capacity has been detected, as an input location. The portable terminal P1 is provided with a control driver for controlling the operation of each part of the portable terminal P1, such as displaying an object on the display screen of the display device Y1 or controlling the transmission and reception of audio data. The control driver makes controls, for example, switching an object displayed on the display screen to another object, based on the input detection signals from the location detection driver. The control driver and the location detection driver may be physically the same driver, or they may be physically different drivers.

The above embodiment illustrates one specific example of the embodiment of the present invention, and can be modified variously. Hereinafter, some main modifications will be described.

First Modification

Figure 7:
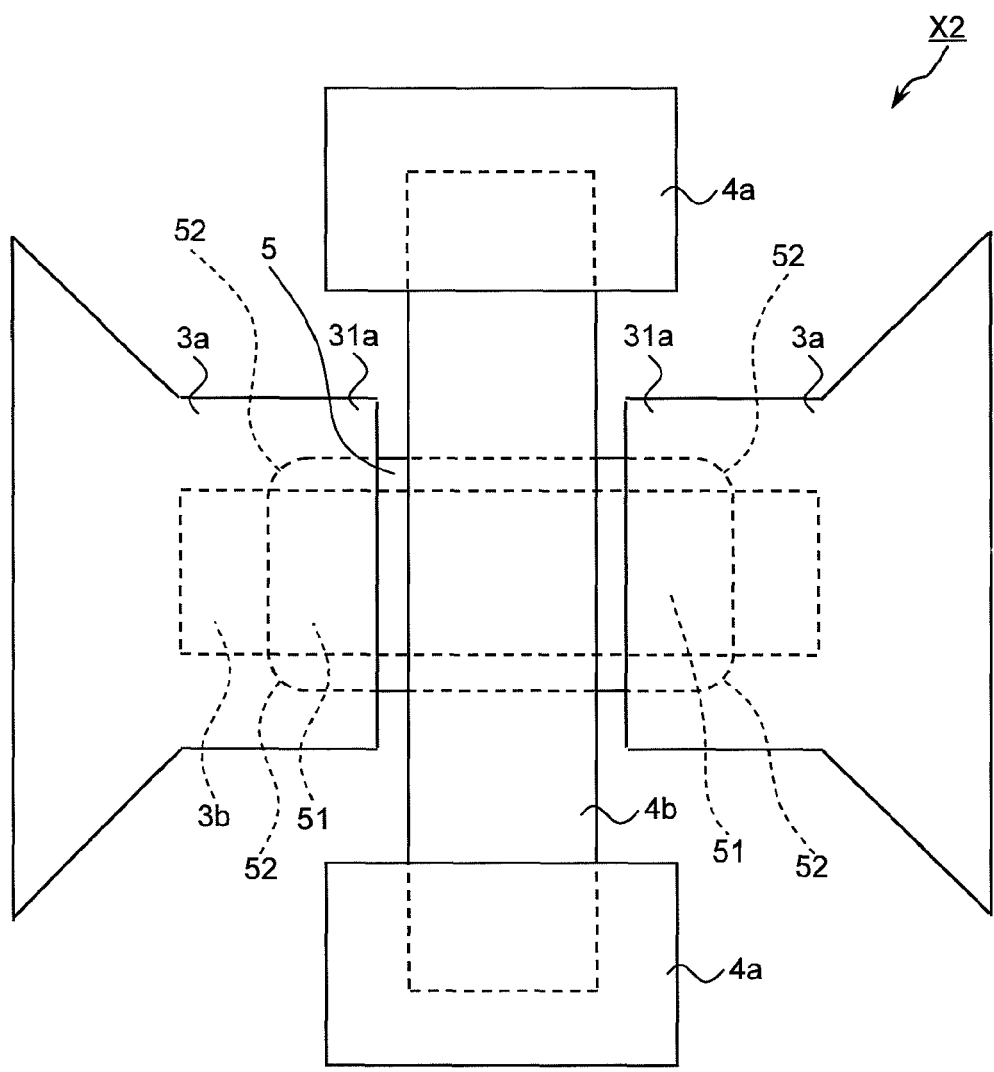
FIG. 7 is a plan view illustrating a schematic configuration of an input device according to a first modification.

FIG. 7 is a plan view illustrating the schematic configuration of input device X2 according to a first modification. FIG. 7 is a plan view depicting the same part of FIG. 4. In FIG. 7, structures having the same functions of FIG. 4 are denoted with the same reference sings, and their detailed description will be omitted.

As illustrated in FIG. 7, in the input device X2, the corners 52 of the insulator 5 have a rounded shape in the plan view. Since the corners 52 of the insulator 5 are rounded, even when a stress applies to the insulator 5, this stress is alleviated due to the rounded shape of the corners 52 of the insulator 5. In addition, in the input device X2, ends 31a of adjacent first detection electrodes 3a, respectively, are provided so as to interpose the second connection electrode 4b therebetween, and to cover the corners 52 of the insulator 5, respectively. Therefore, the input device X2 further reduces the possibility of the insulators 5 peeling off the substrate 2. Therefore, the input device X2 may further improve the reliability as compared with the input device X1.

Second Modification

Figure 8:
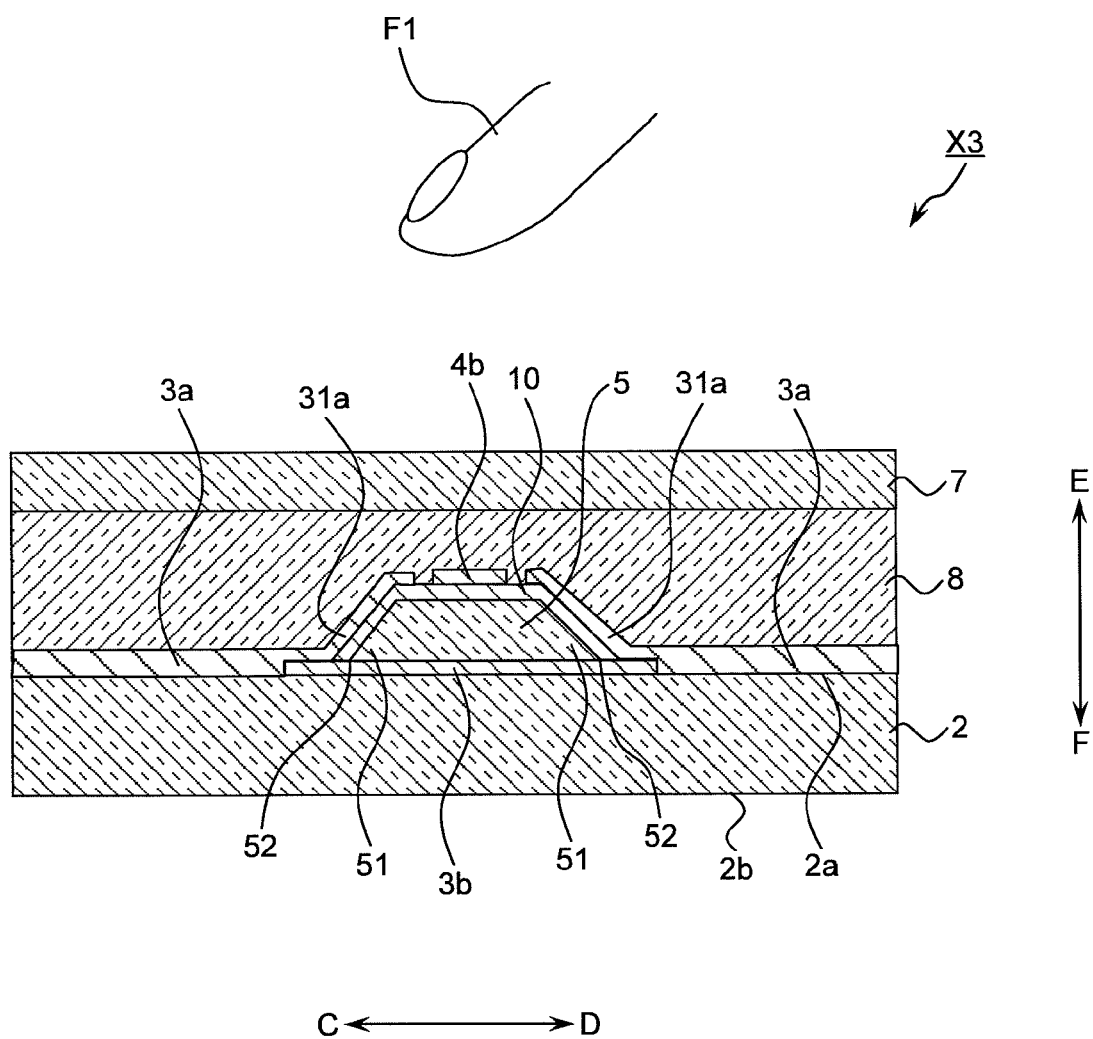
FIG. 8 is a sectional view illustrating a schematic configuration of an input device according to a second modification.
Figure 9:
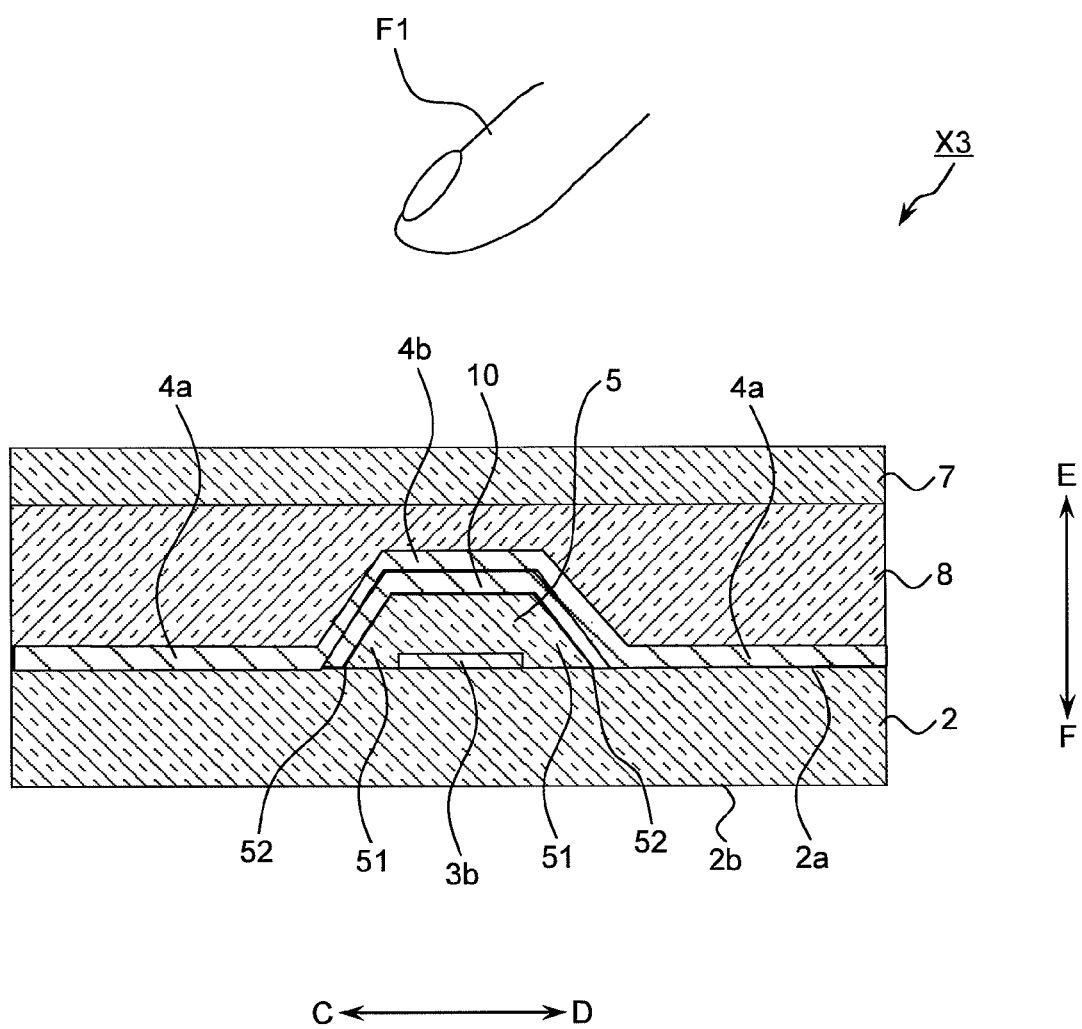
FIG. 9 is a sectional view illustrating the schematic configuration of the input device according to the second modification.
Figure 10:
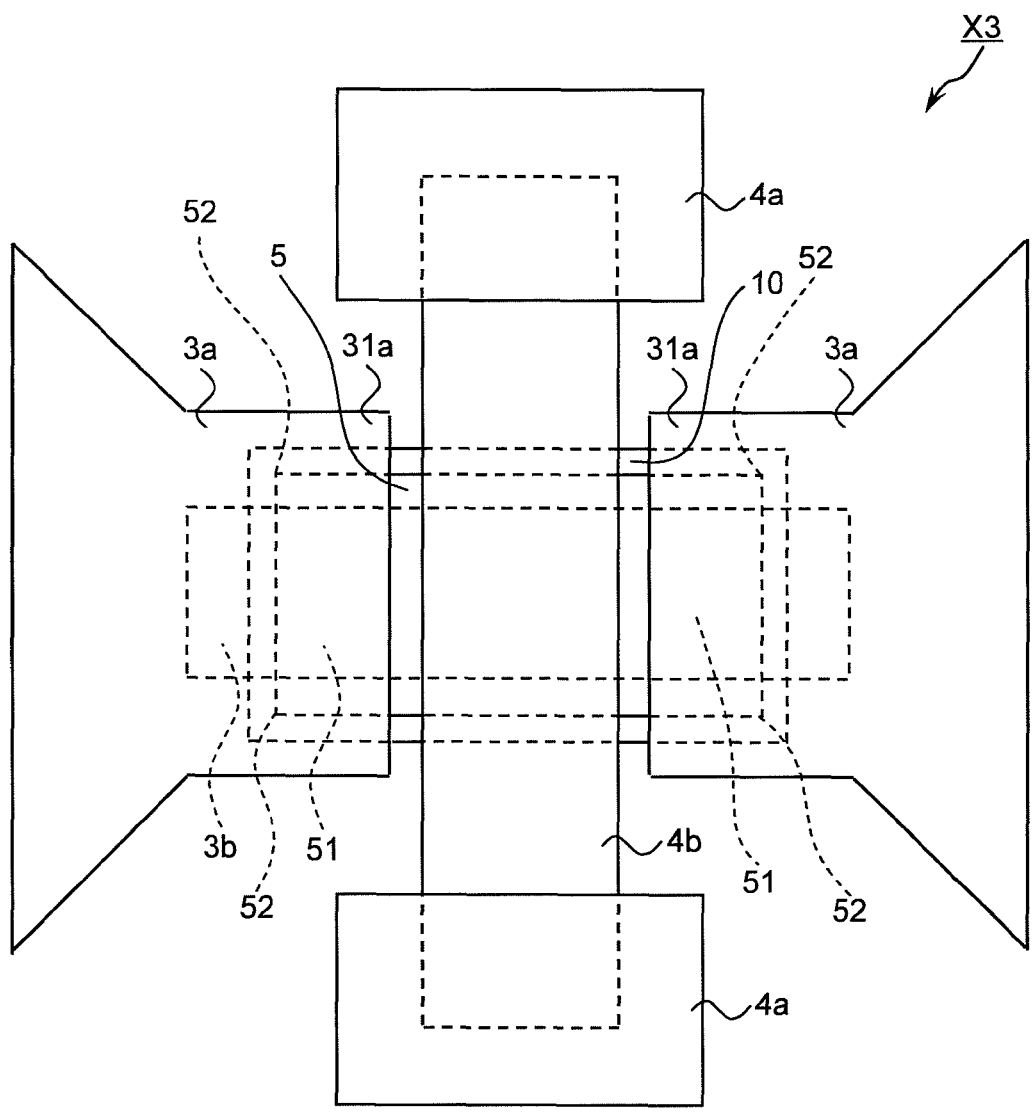
FIG. 10 is a plan view illustrating the schematic configuration of the input device according to the second modification.

FIGS. 8 and 9 are sectional views illustrating the schematic configuration of input device X3 according to a second modification. FIG. 10 is a plan view illustrating the schematic configuration of the input device X3 according to the second modification. FIG. 8 is a sectional view depicting the same part of FIG. 2, FIG. 9 is a sectional view depicting the same part of FIG. 3, and FIG. 10 is a sectional view depicting the same part of FIG. 4. In FIGS. 8 to 10, the structures having the same functions of FIGS. 2 to 4 are denoted with the same reference sings, and their detailed description will be omitted.

As illustrated in FIGS. 8 to 10, the input device X3 is provided with protective films 10 on or above the first main surface 2a of the substrate 2 such that the protective film 10 covers the insulator 5. The protective film 10 may include, for example, an inorganic film and the like made of silicon dioxide. That is, in the input device X3, each second connection electrode 4b is provided on or above the upper surface of the protective film 10 provided on or above the insulator 5. In addition, in the input device X3, the ends 31a of the adjacent first detection electrodes 3a, respectively, are provided on or above the upper surface of the first main surface 2a and the protective film 10 so as to interpose the second connection electrode 4b therebetween and cover both ends 51 of the insulator 5, respectively.

That is, the insulator 5 is covered by not only the second connection electrode 4a and the two ends 31a of first detection electrodes 3a but also by the protective film 10 in the plan view as compared with the insulators 5 of the input device X1. Therefore, even when a stress is given on the insulator 5 in response to input operations, in which the user pushes repeatedly, the input device X3 may reduce the possibility of the insulator 5 to be peeled off from the substrate 2. Therefore, the input device X3 may improve the reliability as compared with the input device X1.

In addition, since the insulator 5 is covered with the protective film 10, the input device X3 may inhibit the adsorption of moisture on the insulator 5 as compared with the input device X1.

Third Modification

Figure 11:
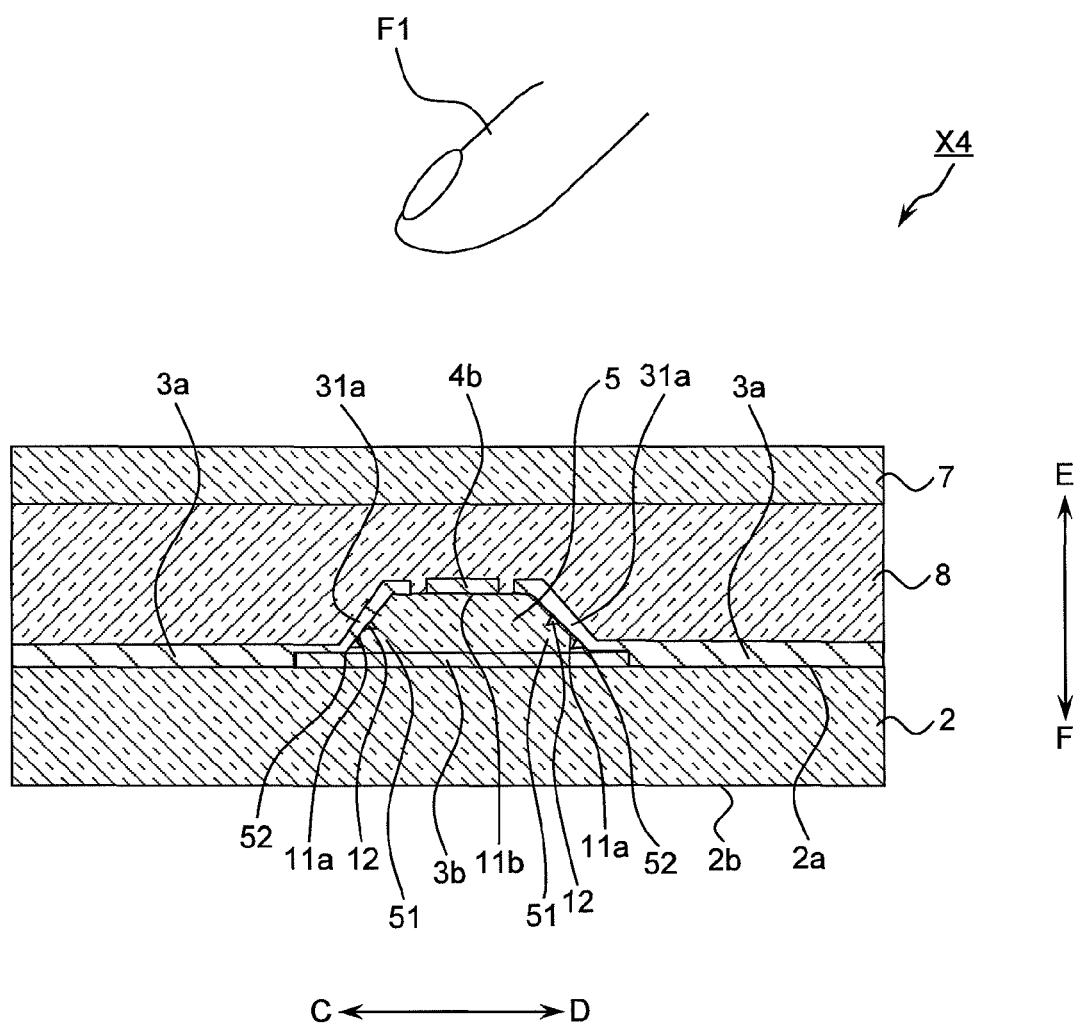
FIG. 11 is a sectional view illustrating a schematic configuration of an input device according to a third modification.
Figure 12:
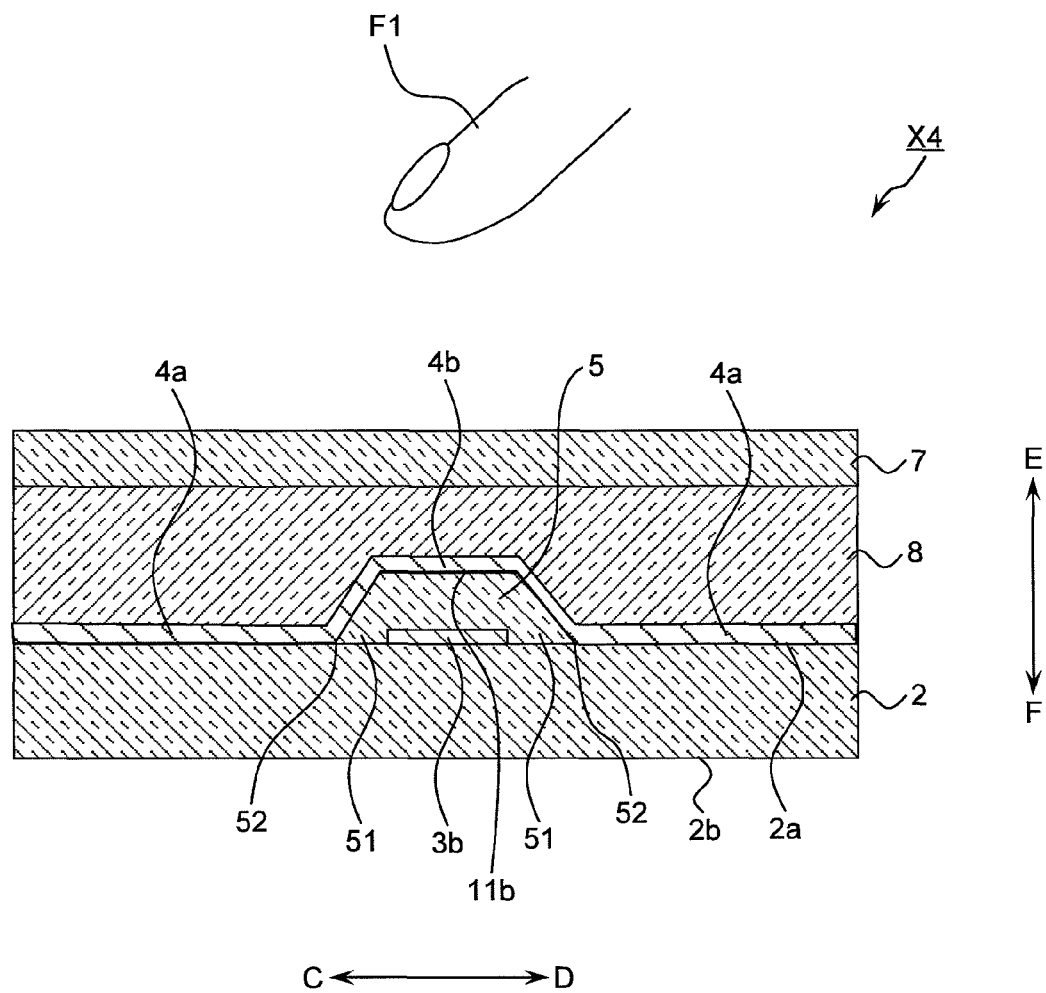
FIG. 12 is a sectional view illustrating the schematic configuration of the input device according to the third modification.

FIGS. 11 and 12 are sectional views illustrating the schematic configuration of input device X4 according to a third modification. FIG. 11 is a sectional view depicting the same part of FIG. 2, and FIG. 12 is a sectional view depicting the same part of FIG. 3. In FIGS. 11 to 12, the structures having the same functions of FIGS. 2 to 3 are denoted with the same reference sings, and their detailed description will be omitted.

As illustrated in FIGS. 11 to 12, in the input device X4, the surface roughness of a contact surface 11a of the insulator 5, which is in contact with the first detection electrodes 3a, is greater than the surface roughness of a contact surface 11b of the insulator 5, which is in contact with the second connection electrode 4b. In the third modification, the contact surface 11a of the insulator 5 has a plurality of pores 12 in order to increase the surface roughness of the contact surface 11a of the insulator 5 more than the surface roughness of the contact surface 11b of the insulator 5. The pores 12 are formed by a sandblasting method, for example. The shape, depth, numbers and the like of the pores 12 are not specifically limited. Since the surface roughness of the contact surface 11a of the insulator 5 is greater than the surface roughness of the contact surface 11b of the insulator 5, the area of the contact surface 11a of the insulator 5 increases. As the area of the contact surface 11a of the insulator 5 increases, the contact strength between the first detection electrodes 3a and the insulator 5 improves in the input device X4 as compared with the input device X1. Thus, the input device X4 further reduces the possibility of the insulators 5 to be peeled off from the substrate 2 as compared with the input device X1. Therefore, the input device X4 may improve the reliability as compared with the input device X1.

The detection electrodes 3a and 4a and the connection electrodes 3b and 4b are formed by a sputtering method, an evaporation method or a chemical vapor deposition (CVD) method, for example. Thus, contrary to the above, if the surface roughness of the contact surface 11b of the insulator 5 is greater than the surface roughness of the contact surface 11a of the insulator 5, projections and depressions are formed around the periphery of the second connection electrode 4b located on or above the contact surface 11a of the insulator 5. If projections and depressions are formed around the periphery of the second connection electrode 4b, there is a possibility that the second connection electrode 4b and the first detection electrode 3a are inadvertently conducted to each other, and that malfunctions may occur. From this point as well, it is preferable that the surface roughness of the contact surface 11a of the insulators 5 is higher than the surface roughness of the contact surface 11b of the insulators 5.

Fourth Modification

Figure 13:
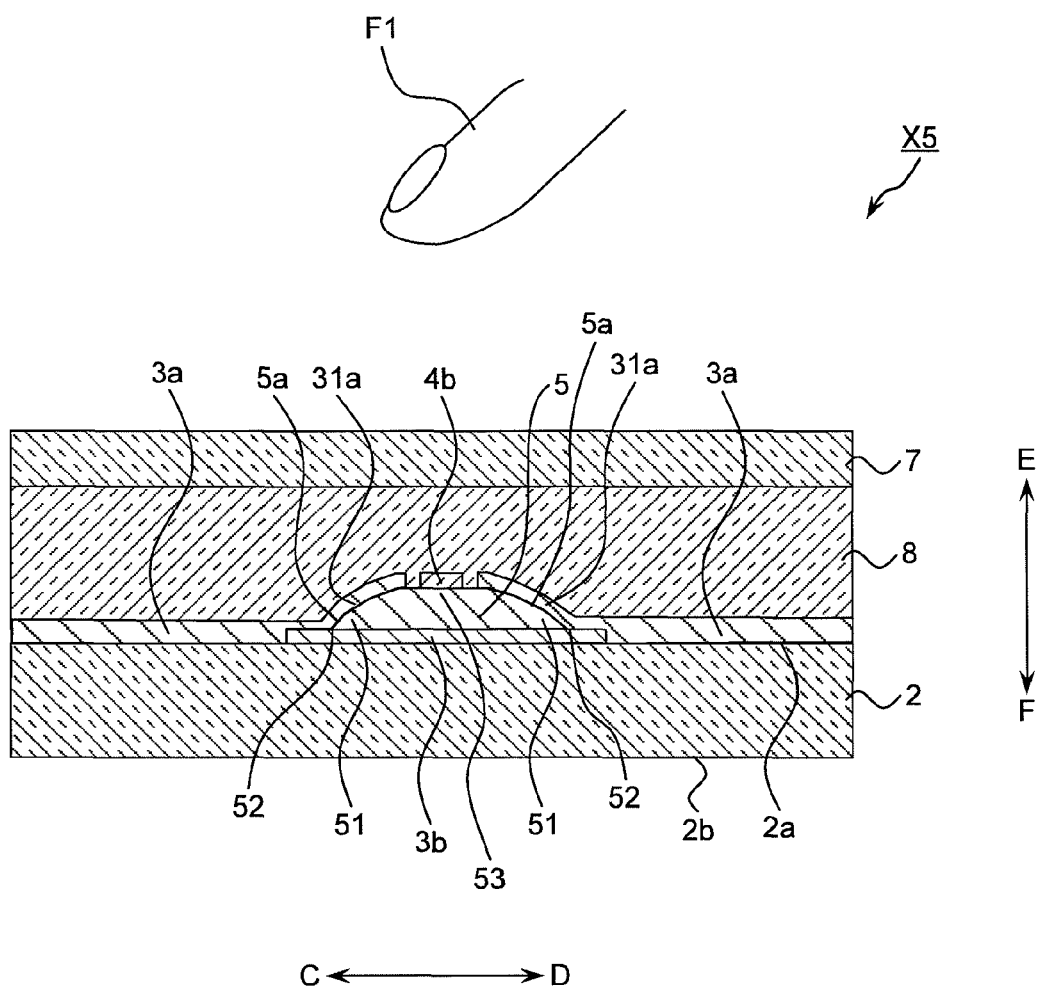
FIG. 13 is a sectional view illustrating a schematic configuration of an input device according to a fourth modification.
Figure 14:
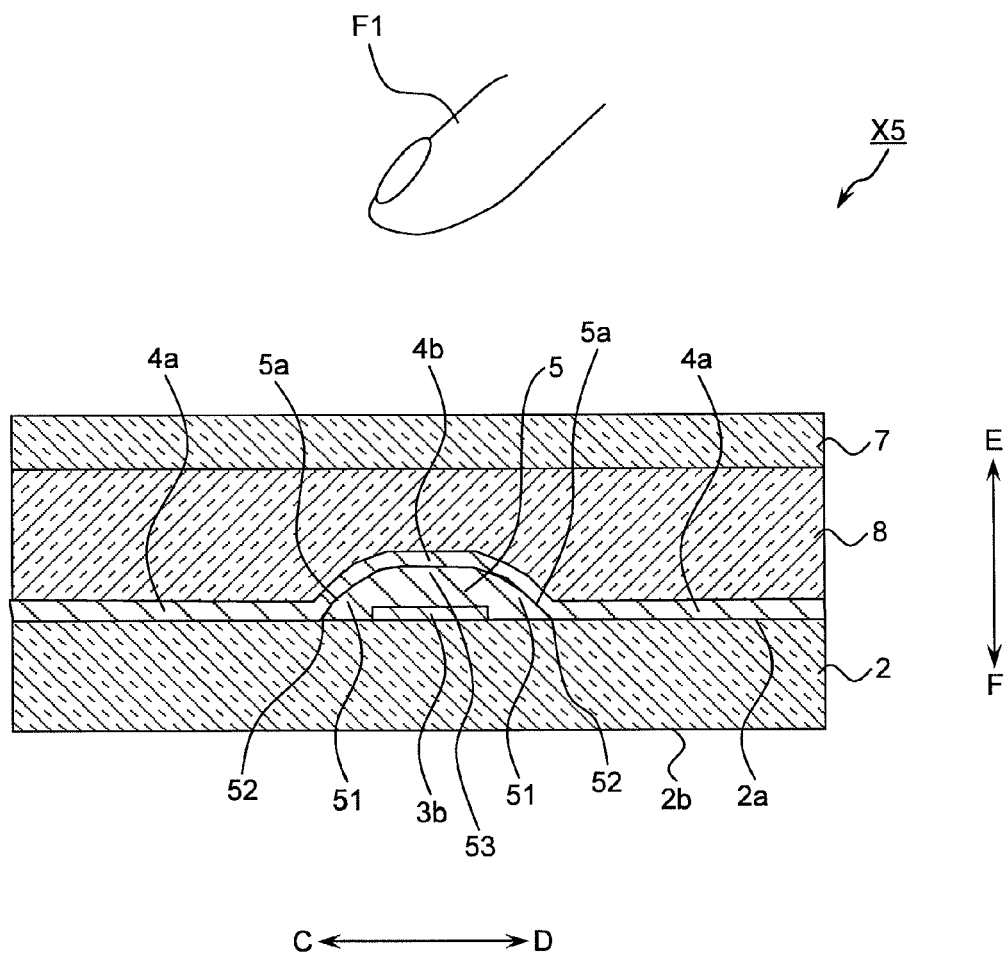
FIG. 14 is a sectional view illustrating the schematic configuration of the input device according to the fourth modification.

FIGS. 13 and 14 are sectional views illustrating the schematic configuration of input device X5 according to a fourth modification. FIG. 13 is a sectional view depicting the same part of FIG. 2, and FIG. 14 is a sectional view depicting the same part of FIG. 3. In FIGS. 13 and 14, the structures having the same functions of FIGS. 2 and 3 are denoted with the same reference sings, and their detailed description will be omitted.

As illustrated in FIGS. 13 and 14, in the input device X5, the insulator 5 has a convex curved surface 5a within a region from an end 51 to a top 53. That is, in the input device X5, each of ends 31a of adjacent first detection electrodes 3a, respectively, is positioned on or above the convex surface 5a of the insulator 5. Since the insulator 5 has the convex curved surface 5a, a stress applied to the insulator 5 is alleviated at the convex curved surface 5a. Thus, the input device X5 further reduces the possibility of the insulators 5 to be peeled off from the substrate 2 as compared with the input device X1. Therefore, the input device X5 may improve the reliability as compared with the input device X1.

The convex surface 5a of the insulators 5 may be provided with a concave portion. In this way, a stress applied to the insulator 5 is still alleviated at the concave portion provided on or above the convex curved surface 5a of the insulator 5. Alternatively, the convex curved surface 5a of the insulator 5 may be provided with a plurality of protrusions and depressions.

Fifth Modification

Although in the above embodiments, the description has been made of an example where the display panel bonded with an input device X1 is a liquid crystal display, it is not limited thereto. That is, the display panel equipped with the input device X1 may include a CRT, a plasma display, an organic EL display, an inorganic EL display, a LED display, a fluorescent display tube, a field emission display, a surface-conduction electron-emitter display, an electronic paper, and the like.

In addition, although in the above embodiments, the description was made of an example of the display device Y1 provided with the input device X1, the input device X1 may be replaced with the input device X2, the input device X3, the input device X4, or the input device X5. Additionally, although in the above embodiments, the description was made of an example of the portable terminal P1 provided with the display device Y1, the display device Y1 may be replaced with a display device provided with the input device X2, the input device X3, the input device X4, or the input device X5.

Furthermore, the above embodiments and modified examples may be suitably combined.

EXPLANATIONS OF LETTERS OR NUMERALS

X1-X5 INPUT DEVICE
Y1 DISPLAY DEVICE
P1 PORTABLE TERMINAL
2 SUBSTRATE
2a FIRST MAIN SURFACE
2b SECOND MAIN SURFACE
3a FIRST DETECTION ELECTRODE
3b FIRST CONNECTION ELECTRODE
4a SECOND DETECTION ELECTRODE
4b SECOND CONNECTION ELECTRODE
5 INSULATOR
5a CONVEX CURVED SURFACE
51 END OF INSULATOR
52 CORNER OF INSULATOR
53 TOP OF INSULATOR
10 PROTECTIVE FILM
70 LIQUID CRYSTAL DISPLAY PANEL (DISPLAY PANEL)
100 HOUSING

The invention claimed is:
1. An input device comprising:
a substrate;
first detection electrodes provided on or above the substrate and arrayed along a first direction;
second detection electrodes provided on or above the substrate and arrayed along a second direction;
a first connection electrode provided on or above the substrate and connecting adjacent first detection electrodes;
an insulator provided on or above the substrate so as to cover the first connection electrode; and
a second connection electrode provided on or above the insulator so as to straddle over the insulator, and connecting adjacent second detection electrodes,
wherein a portion of the first detection electrodes covers a portion of the insulator.
2. The input device according to claim 1, wherein ends of adjacent first detection electrodes, respectively, interpose the second connection electrode therebetween, and provided so as to cover both ends of the insulator, respectively.
3. The input device according to claim 1, wherein
the insulator has a rectangular shape in a plan view, and
ends of adjacent first detection electrodes, respectively, interpose the second connection electrode therebetween, and provided so as to cover corners of the insulator, respectively.
4. The input device according to claim 1, wherein
corners of the insulator has a rounded shape in a plan view, and
ends of adjacent first detection electrodes, respectively, interpose the second connection electrode therebetween, and provided so as to cover corners of the insulator, respectively.
5. The input device according to claim 1, further comprising a protective film provided on or above the substrate so as to cover the insulator.
6. The input device according to claim 1, wherein surface roughness of a contact surface of the insulator in contact with the first detection electrodes is greater than surface roughness of a contact surface of the insulator in contact with the second connection electrode.
7. The input device according to claim 1, wherein the insulator has a convex curved surface in a region from an end to a top.
8. A display device comprising:
the input device according to claim 1; and
a display panel arranged opposing the input device.
9. The display device according to claim 8, wherein the display panel is a liquid crystal display panel.
10. A portable terminal comprising the display device according to claim 8 in a housing.

* * * * *